(12) United States Patent
Terao et al.

(10) Patent No.: US 9,299,636 B2
(45) Date of Patent: Mar. 29, 2016

(54) HEAT SINK FOR ELECTRONIC DEVICE AND PROCESS FOR PRODUCTION THEREOF

(75) Inventors: Hoshiaki Terao, Niigata (JP); Hidoaki Kobiki, Tokyo (JP)

(73) Assignee: JFE Precision Corporation (JP)

( * ) Notice: Subject to any disclaimer, the term of this patent is extended or adjusted under 35 U.S.C. 154(b) by 639 days.

(21) Appl. No.: 13/499,308

(22) PCT Filed: Oct. 1, 2010

(86) PCT No.: PCT/JP2010/005923
§ 371 (c)(1),
(2), (4) Date: Apr. 11, 2012

(87) PCT Pub. No.: WO2011/040044
PCT Pub. Date: Apr. 7, 2011

(65) Prior Publication Data
US 2012/0186800 A1    Jul. 26, 2012

(30) Foreign Application Priority Data
Oct. 1, 2009   (JP) ................................ 2009-229270

(51) Int. Cl.
| | |
|---|---|
| B32B 15/01 | (2006.01) |
| H01L 23/373 | (2006.01) |
| B22F 3/26 | (2006.01) |
| C22C 9/00 | (2006.01) |
| C22C 27/06 | (2006.01) |
| C22C 30/02 | (2006.01) |
| C22F 1/08 | (2006.01) |
| C22F 1/18 | (2006.01) |
| C22C 1/04 | (2006.01) |

(Continued)

(52) U.S. Cl.
CPC .............. *H01L 23/3735* (2013.01); *B22F 3/26* (2013.01); *B22F 7/04* (2013.01); *B32B 15/01* (2013.01); *C22C 1/045* (2013.01); *C22C 1/0425* (2013.01); *C22C 9/00* (2013.01); *C22C 27/06* (2013.01); *C22C 30/02* (2013.01); *C22F 1/08* (2013.01); *C22F 1/11* (2013.01); *C22F 1/18* (2013.01); *H01L 23/3736* (2013.01); *B22F 2007/045* (2013.01); *H01L 23/473* (2013.01); *H01L 2224/32225* (2013.01)

(58) Field of Classification Search
USPC .......................................... 428/668, 674–675
See application file for complete search history.

(56) References Cited

U.S. PATENT DOCUMENTS

| 2001/0036418 A1 | 11/2001 | Hauner et al. |
| 2002/0017346 A1 | 2/2002 | Osada et al. |

FOREIGN PATENT DOCUMENTS

| CN | 101384739 A | 3/2009 |
| EP | 1 231 633 | 8/2002 |

(Continued)

OTHER PUBLICATIONS

English Machine Translation of JP 2008-240007, JPO, accessed Nov. 20, 2014.*

(Continued)

*Primary Examiner* — Humera Sheikh
*Assistant Examiner* — Lucas Wang
(74) *Attorney, Agent, or Firm* — DLA Piper LLP (US)

(57) ABSTRACT

A heat sink for an electronic device includes a Cr—Cu alloy layer including a Cu matrix and more than 30 mass % and not more than 80 mass % of Cr; and Cu layers provided on top and rear surfaces of the Cr—Cu alloy layer.

16 Claims, 6 Drawing Sheets

(51) Int. Cl.
*C22F 1/11* (2006.01)
*H01L 23/473* (2006.01)
*B22F 7/04* (2006.01)

(56) References Cited

FOREIGN PATENT DOCUMENTS

| | | |
|---|---|---|
| EP | 1 566 456 | 8/2005 |
| JP | 11-284111 A | 10/1999 |
| JP | 3267565 | 3/2002 |
| JP | 2004-249589 A | 9/2004 |
| JP | 2005-330583 | 12/2005 |
| JP | 2005-344166 | 12/2005 |
| JP | 2007-035985 A | 2/2007 |
| JP | 2007-142126 A | 6/2007 |
| JP | 4138844 B2 | 8/2008 |
| JP | 2008-240007 A | 10/2008 |
| JP | 2009-038366 A | 2/2009 |
| WO | 2009/008457 A1 | 1/2009 |

OTHER PUBLICATIONS

Japanese Notification of Reasons for Refusal dispatched Jul. 8, 2014 along with an English translation from corresponding Japanese Patent Application No. 2010-224217.

Chinese Official Action dated Apr. 30, 2014 from corresponding Chinese Patent Application No. 201080051690.3 along with English translation.

European Search Report dated Feb. 12, 2014 from corresponding European Patent Application No. EP 10 82 0165.

Chinese Office Action dispatched Dec. 3, 2014 from corresponding Chinese Patent Application No. 201080051690.3 along with an English translation.

European Office Action dated Feb. 23, 2015 from corresponding European Patent Application No. 10 820 165.8.

Korean Office Action dated Nov. 17, 2015 of corresponding Korean Application No. 2015-079605807 and its Concise Statement of Relevance of Office Action.

* cited by examiner

Diffusion bonding temperature

Cooled to room temperature

Magnitude of shrinkage : Cu>Cr

HEAT SINK FOR ELECTRONIC DEVICE AND PROCESS FOR PRODUCTION THEREOF

RELATED APPLICATIONS

This is a §371 of International Application No. PCT/JP2010/005923, with an international filing date of Oct. 1, 2010 (WO 2011/040044 A1, published Apr. 7, 2011), which is based on Japanese Patent Application No. 2009-229270, filed Oct. 1, 2009, the subject matter of which is incorporated by reference.

TECHNICAL FIELD

This disclosure relates to a heat sink suitably used for quickly dissipating heat generated from a heat-generating body such as a semiconductor element and the like mounted in an electronic device and a process for producing the heat sink. In particular, the disclosure relates to advantageous improvement of coefficient of thermal (heat) expansion and thermal (heat) conductivity, i.e., achieving relatively low thermal expansion coefficient and relatively high thermal conductivity, of a heat sink.

BACKGROUND

Demand for high-output power semiconductor parts, which are for use in an inverter of a hybrid car or the like, is rapidly increasing in recent years.

In a power semiconductor part as described above, a semiconductor is generally bonded with a ceramic substrate. Examples of the ceramic substrate include a laminated substrate as copper-metalized alumina ceramics, i.e., direct bonded copper (DBC) substrate, and a laminated substrate as aluminum-metalized aluminum nitride, i.e., direct bonded aluminum (DBA) substrate.

Since it is preferable that a semiconductor quickly dissipates heat generated by itself, the semiconductor is cooled by air or water eventually. To efficiently carry out such cooling by air or water and prevent the cooling from adversely affecting other elements in a relatively small space in an electronic device, a ceramic substrate generally bonded with a semiconductor by solder is further combined with a material having relatively high thermal conductivity to constitute a laminated structure.

A ceramic substrate, having relatively low thermal expansion coefficient like a semiconductor material such as Si, can achieve reliable bonding between a semiconductor and itself. The most commonly used heat sink material to be laminated with such a ceramic substrate as described above is pure copper. That is, a ceramic substrate is often air-cooled by way of copper plate laminated therewith. However, there is a problem with pure copper that pure copper exhibits relatively high thermal expansion coefficient and thus relatively large discrepancy in thermal expansion coefficient between the ceramic substrate and itself, thereby generating relatively large thermal stress at the bonding interface between the copper plate and the ceramic substrate and causing damage to the semiconductor and/or causing the semiconductor to come off from the ceramic substrate. Accordingly, in a case where such a conventional heat sink material as described above is used, the heat sink material must have sufficient thickness to alleviate thermal stress.

An inverter for use in a hybrid car, which generates a relatively large amount of heat, is coupled with a cooling device made of aluminum for water cooling. Examples of a heat sink material in this case include a Mo—Cu material having relatively high thermal conductivity and relatively low thermal expansion coefficient. However, such a Mo—Cu material as described above as a heat sink material, although it achieves reliable bonding between a ceramic substrate and itself due to relatively close thermal expansion coefficients thereof, causes a problem that the Mo—Cu material and the cooling device made of aluminum have to be coupled with each other by screws by way of silicon grease because of relatively large difference in thermal expansion coefficient between the Mo—Cu material and the cooling device made of Al.

We disclosed in JP-B 4138844, as an alternative material for the Mo—Cu material described above, a relatively inexpensive Cr—Cu alloy having both relatively low thermal expansion properties and relatively high thermal conductivity. The Cr—Cu alloy described above is produced by making Cu infiltrate a porous Cr sintered body and then subjecting the sintered body to rolling. As shown in the Example of JP-B 4138844, a rolled material (rolling reduction rate: 72%) exhibits a good effect of decreasing thermal expansion coefficient. However, in this case, when thermal conductivity of the material in an in-plane direction thereof is compared with thermal conductivity in thickness direction, the former is approximately 200 W/mK, while the latter is approximately 150 W/mK, indicating relatively poor thermal conductivity in thickness direction of the material. When the Cu-infiltrated Cr sintered body is rolled, the Cr phase is expanded in the rolling direction and the resulting Cr—Cu alloy exhibits a laminated structure of Cr layers as shown in FIG. 1 of JP-B 4138844. This Cr phase (specifically, layered-grains of the Cr phase) having lower thermal conductivity than the Cu phase presumably disturbs smooth dissipation of heat in thickness direction of the rolled material, although the Cu phase somehow continuously exists in the thickness direction. In contrast, it is assumed that heat can easily dissipate along the Cu phase in an in-plane direction of the rolled material. It has been confirmed that the larger rolling reduction rate results in the larger difference in characteristics between an in-plane direction and the thickness direction of the rolled material.

In a case where the aforementioned Cr—Cu alloy is used for a heat sink plate or sheet, the problem of directionality of thermal conductivity caused by rolling is rendered relatively insignificant when heat is generated from only a part of the relevant surface because then a good effect of dissipating heat in in-plane directions can be expected in a compensating manner in spite of relatively low thermal conductivity in the thickness direction. However, when heat is received by the entire portion of the relevant surface of the heat sink plate and has to be dissipated from another or the opposite surface of the heat sink plate, the heat sink plate cannot demonstrate satisfactory heat-sink properties because thermal conductivity in the thickness direction of the heat sink plate then substantially determines the heat-sink properties of the heat sink plate.

JP-A 2007-035985 discloses a Cr—Cu/Cu composite alloy having one surface constituted of Cr—Cu alloy and the other surface constituted of Cu. That composite alloy is produced by placing a Cu plate on a porous Cr sintered body and making a portion of Cu infiltrate the Cr sintered body by a heating treatment so that the rest of Cu remains on the Cr sintered body, thereby obtaining a two-layer structure including a Cr—Cu alloy layer and a Cu layer.

In the case of such a composite alloy as described above, however, there is a problem that shrinkage cavity is generated in the Cu layer due to solidification shrinkage after the infiltration treatment. The larger size of the sintered body leads to the more conspicuous shrinkage cavity, which is hard to handle. Thickness of a Cu layer must be increased to form the Cu layer free of such shrinkage cavity as described above. However, increase in thickness of a Cu layer raises a concern of higher cost for materials.

It could therefore be helpful to provide a heat sink for an electronic device having relatively low thermal expansion properties, excellent thermal conductivity particularly in the direction of thickness, and a reduced entire thickness, as well as an advantageous method for producing the heat sink.

SUMMARY

We discovered as described below:
a) laminating a Cr—Cu material and a Cu material alternately improves thermal conductivity in thickness direction of a resulting Cr—Cu sheet material; and
b) the resulting Cr—Cu sheet material exhibits good rolling properties, as compared with a W—Cu material and the like. Accordingly, a product obtained by diffusion bonding of a Cu-infiltrated Cr material and a Cu material can be processed by cold rolling.

We thus provide:
1. A heat sink for an electronic device, comprising: a Cr—Cu alloy layer including a Cu matrix and more than 30 mass % and not more than 80 mass % of Cr; and Cu layers provided on top and rear surfaces of the Cr—Cu alloy layer.
2. A heat sink for an electronic device, comprising: a laminate constituted of at least one Cr—Cu alloy layer including a Cu matrix and more than 30 mass % and not more than 80 mass % of Cr, and at least one Cu layer, which layers are alternately laminated, wherein the outmost layer of each of top and rear surfaces of the laminate is constituted of a Cu layer.
3. The heat sink for an electronic device of item 1 or 2 above, wherein the Cu layer as the outermost layer of one of top and rear surfaces of the laminate is thicker than the Cu layer as the outermost layer of the other of the top and rear surfaces of the laminate.
4. The heat sink for an electronic device of any of items 1 to 3 above, wherein a Cr phase of the Cr—Cu alloy layer has a flat layer-like structure of which aspect ratio exceeds 10, and density of the flat Cr phase in thickness direction thereof is in the range of 10 phases/mm to 1000 phases/mm (inclusive of 10 phases/mm and 1000 phases/mm).
5. The heat sink for an electronic device of item 4 above, wherein the Cr—Cu alloy layer includes, in addition to the flat Cr phase, Cr grains in the Cu matrix each having long diameter of not larger than 100 nm and aspect ratio of less than 10, and density of the Cr grains is at least 20 grains/$\mu m^2$.
6. The heat sink for an electronic device of any of items 1 to 5 above, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.
7. The heat sink for an electronic device of any of items 1 to 6 above, wherein bonding between the Cr—Cu alloy layer and the Cu layer is diffusion bonding.
8. A method for producing the heat sink for an electronic device of any of items 1 to 7 above, comprising the steps of: joining a Cr—Cu alloy sheet having a Cu matrix and more than 30 mass % and not more than 80 mass % of Cr to a Cu sheet; and rolling the joined product, thereby producing a laminate having a Cr—Cu alloy layer and a Cu layer.
9. A method for producing the heat sink for an electronic device of any of items 1 to 7 above, comprising the steps of: preparing a Cu-infiltrated Cr sintered body containing a Cu matrix and more than 30 mass % and not more than 80 mass % of Cr; rolling the Cu-infiltrated Cr sintered body, to obtain a Cr—Cu rolled sheet; joining the Cr—Cu rolled sheet to a Cu sheet, thereby producing a laminate having a Cr—Cu alloy layer and a Cu layer.

It is possible to obtain a heat sink for an electronic device having relatively low thermal expansion properties, excellent thermal conductivity not only in in-plane directions but also in the direction of thickness, and a reduced entire thickness.

EXPLANATION OF REFERENCE NUMERALS

1 Heat sink
2 Aluminum cooling device

DETAILED DESCRIPTION

Figure 1:
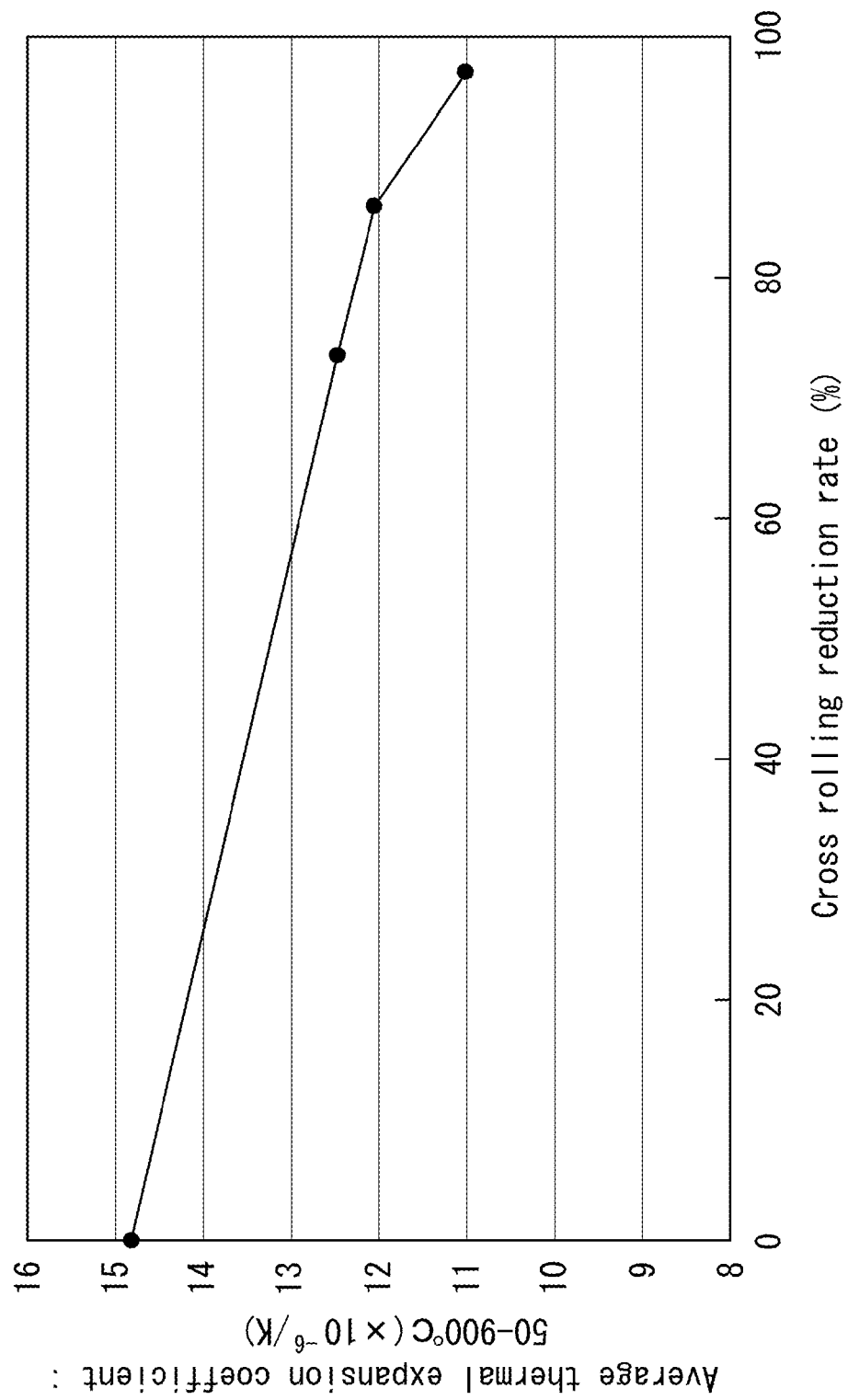
FIG. 1 is a graph showing a relationship between rolling reduction rate in cross-rolling of a Cr—Cu alloy material and the average thermal expansion coefficient in the range of 50° C. to 900° C.

In the case of a Cr—Cu alloy as a single material, rolling formability thereof is very good as disclosed in JP-B 4138844, whereby the Cr—Cu alloy material can be subjected to cold rolling at a relatively high rolling reduction rate. In this regard, thermal expansion coefficient of the material decreases as the rolling reduction rate increases. FIG. 1 shows the aforementioned results in JP-B 4138844, as well as new data obtained under conditions of further larger rolling reduction rate. It has been revealed that thermal expansion coefficient observed in a rolled Cr—Cu alloy material subjected to rolling at a rolling reduction rate around 96% is close to thermal expansion coefficient of pure Cr, as shown in FIG. 1.

When a Cr—Cu alloy material and a Cu material are joined to each other to form a laminate material, thermal expansion coefficient of the laminate material presumably follows "rule of mixture" (in this case, thermal expansion coefficient of a laminate material=(volume ratio of a Cr—Cu alloy material×thermal expansion coefficient of the Cr—Cu alloy material)+(volume ratio of a Cu material×thermal expansion coefficient of the Cu material)). Accordingly, in a case where a Cr—Cu alloy material and a Cu material are simply laminated, it is theoretically assumed that thermal conductivity in thickness direction improves but simultaneously thermal expansion coefficient in in-plane directions increases, as compared with Cr—Cu alloy as a single material.

However, when thermal expansion coefficient of a laminate material obtained by diffusion bonding of a Cr—Cu alloy material and a Cu material is actually measured, it is observed that thermal expansion coefficient of the laminate material tends to be lower than that expected by the rule of mixture.

In particular, a rolled material obtained by diffusion joining (bonding) of a Cr—Cu alloy material and a Cu material and subsequent rolling of the joined product at rolling reduction rate of at least 90% and a laminate material obtained by rolling a Cr—Cu alloy material at rolling reduction rate of at least 80% (preferably at least 90%), alternately laminating the Cr—Cu alloy material thus rolled and a Cu material, and subjecting the laminated product to diffusion joining each exhibit further lower thermal expansion coefficient than that expected by the rule of mixture, thereby proving significant improvement in thermal properties.

Figure 2A:
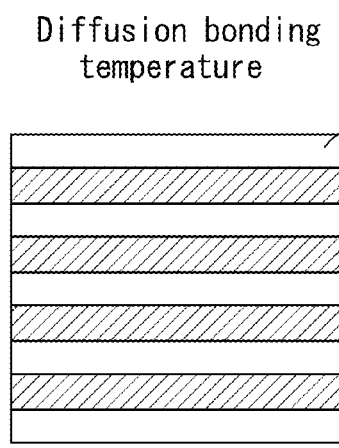
FIG. 2A and FIG. 2B are diagrams respectively showing a state where a Cr—Cu alloy material and a Cu material are diffusion-bonded and a state where compression stresses are generated in the Cu layers due to difference in thermal expansion coefficient between the two materials when temperature has dropped to the room temperature after the diffusion bonding.
Figure 2B:
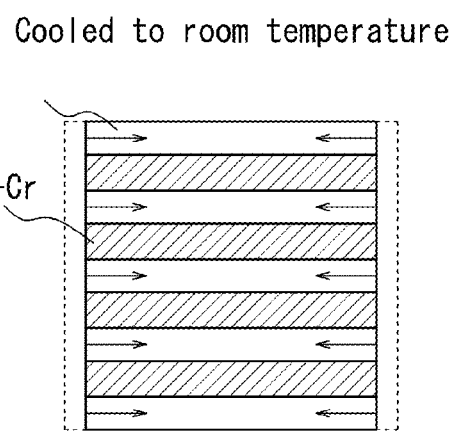

When diffusion bonding is conducted at a relatively high temperature by spark plasma sintering (SPS) or hot press, internal stresses are generated after the diffusion bonding due to difference in magnitude of shrinkage between a Cr—Cu alloy layer and a Cu layer, which difference is caused by difference in thermal expansion coefficient between the Cr—Cu alloy layer material and the Cu layer material. Accordingly, when the joined product is cooled to the room temperature after the diffusion bonding, compression stresses in in-plane directions are generated and remain as internal stresses in the Cu material having larger thermal expansion coefficient than the Cr—Cu alloy material, as shown in FIG. 2.

Figure 3:
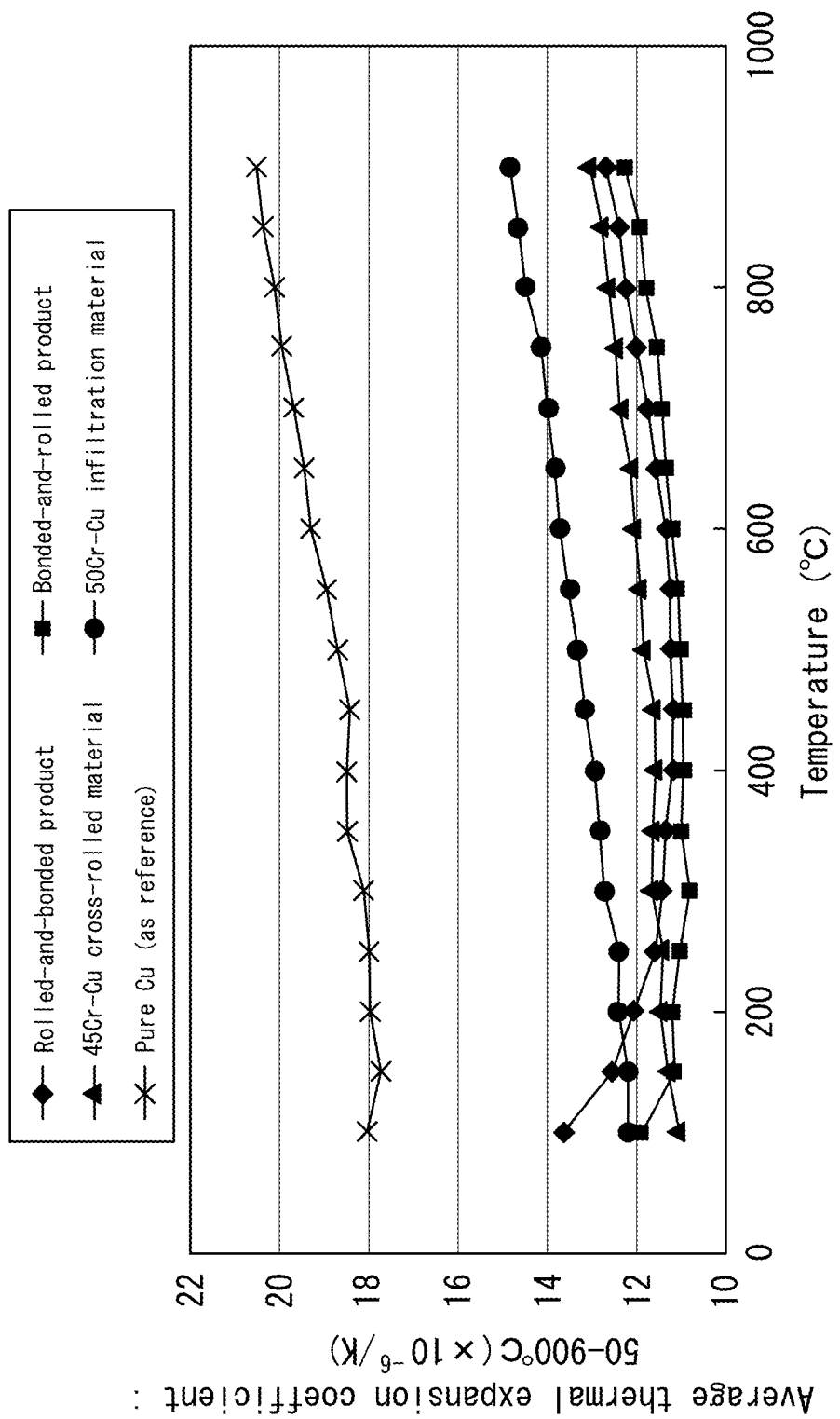
FIG. 3 is a graph showing in a comparative manner the average thermal expansion coefficients in the range of 50° C. to 900° C. of a Cu-infiltrated Cr material (i.e., a Cr—Cu alloy material which has not been rolled), a cross-rolled Cr—Cu alloy material, a product obtained by joining a Cr—Cu alloy material to a Cu material and rolling the joint product, a product obtained by rolling a Cr—Cu alloy material and joining the rolled Cr—Cu alloy material to a Cu material, and pure Cu.

Next, FIG. 3 shows in a comparative manner the average thermal expansion coefficients in the range of 50° C. to 900° C. of a Cu-infiltrated Cr material (i.e., a Cr—Cu alloy material which has not been rolled), a cross-rolled Cr—Cu alloy material, a product obtained by joining a Cr—Cu alloy material to a Cu material and rolling the joint product (which will be referred to a "bonded-and-rolled product" hereinafter), a product obtained by rolling a Cr—Cu alloy material and joining the Cr—Cu alloy material thus rolled to a Cu material (which will be referred to a "rolled-and-bonded product" hereinafter), and pure Cu.

As shown in FIG. 3, a specific phenomenon that the average thermal expansion coefficient decrease significantly until temperature reaches about 400° C. is observed in both the "bonded-and-rolled" product and the "rolled-and-bonded" product. It is assumed that this phenomenon is probably a factor of lowering thermal expansion coefficients of these products than that expected by the rule of mixture. The mechanism of the phenomenon presumably relates, although it has not been clearly revealed yet, to internal stresses generated in diffusion bonding due to difference in thermal expansion coefficient between the Cr—Cu material and the Cu material.

As a result of this phenomenon of lower thermal expansion coefficient than that expected by the rule of mixture, it is possible to obtain a material exhibiting relatively low thermal expansion coefficient when soldering or brazing is conducted.

The larger rolling reduction rate in rolling a Cr—Cu alloy material results in the larger decrease in thermal expansion coefficient of the material, as described above. When the case where a Cu-infiltrated Cr material (not being rolled yet) is diffusion-joined to a Cu material and then the joined product is rolled, is compared with the case where a Cu-infiltrated Cr material which has been rolled or a rolled Cr—Cu alloy material is diffusion-joined to a Cu material, internal stresses generated in diffusion joining due to difference in thermal expansion coefficient between the Cr—Cu alloy material and the Cu material is larger in the latter case. Accordingly, the latter case is more advantageous than the former case in terms of decreasing thermal expansion coefficient. In FIG. 3, when the "bonded-and-rolled" product is compared with the "rolled-and-bonded" product, the "rolled-and-bonded" product or the latter exhibits in a more intensified manner than the former the specific phenomenon that the average thermal expansion coefficient decreases until temperature reaches about 400° C. However, a "bonded-and-rolled" product exhibits sufficiently low thermal expansion coefficient, as compared with the Cr—Cu alloy material which has not been rolled and the cross-rolled Cr—Cu alloy material, and has an advantage that a relatively large rolled sheet can be produced in spite of a relative small joined area in diffusion bonding, which is favorable in terms of mass-production. As another option, there is a method of diffusion-joining a rolled Cr—Cu alloy sheet to a Cu sheet and further rolling the joined product, which method is advantageous in a case where a relatively thick product is to be manufactured at a high rolling reduction rate equal to or larger than 90%.

Figure 4:
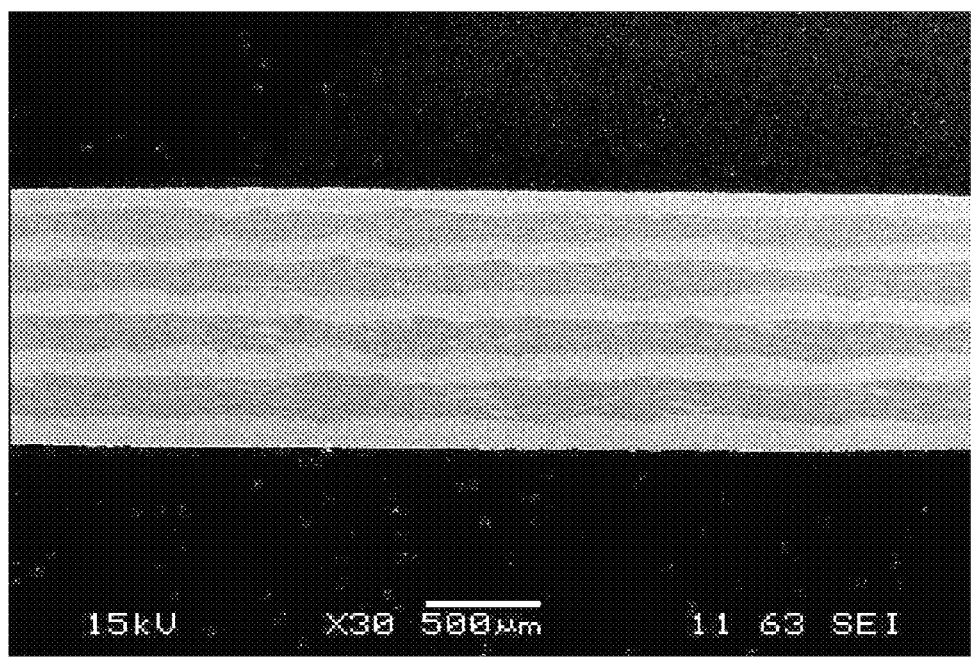
FIG. 4 is a photograph of a section of a heat sink for an electronic device, comprising a Cr—Cu alloy layers and Cu layers.

FIG. 4 shows a photograph of a section of a heat sink constituted of a laminate of a Cr—Cu alloy layer and a Cu layer for an electronic device (which heat sink will be referred to simply as a "heat sink" hereinafter). In the laminate of FIG. 4, a layer of dark color represents a Cr—Cu alloy layer and a layer of pale color represents a Cu layer. The example of FIG. 4 is a heat sink constituted of a laminate having four Cr—Cu alloy layers and five Cu layers, i.e., totaling nine layers.

Figure 5:
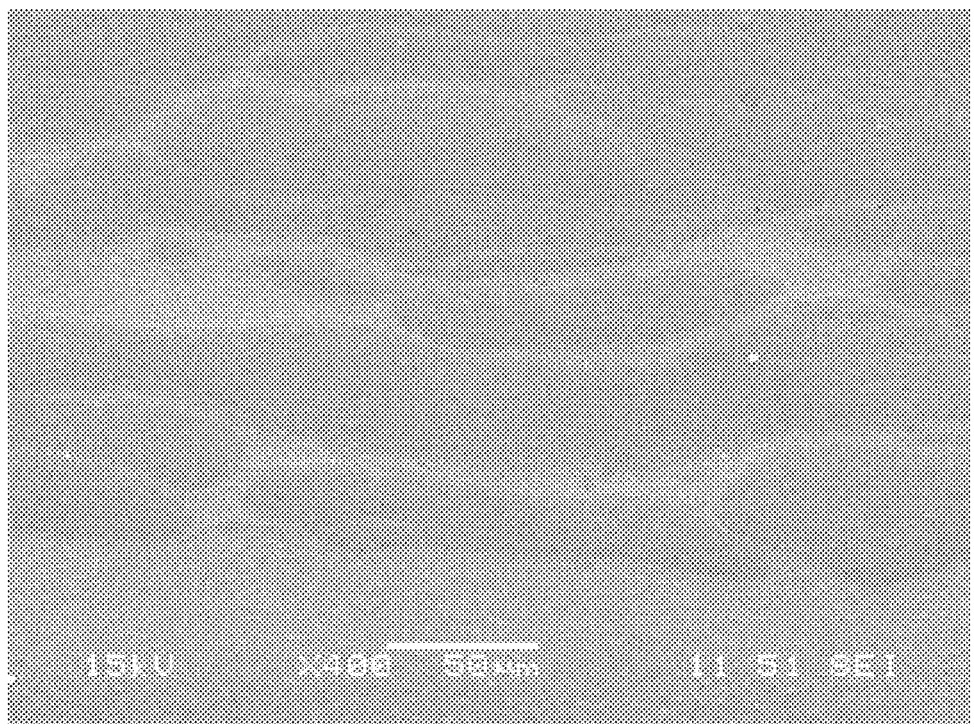
FIG. 5 is a photograph showing in an enlarged manner bonding interfaces between the Cr—Cu alloy layers and the Cu layers.

Next, FIG. 5 is a photograph showing in an enlarged manner bonding interfaces between the Cr—Cu alloy layers and the Cu layers.

Cu in the Cr—Cu alloy layers and the Cu layers are completely fused to each other at bonding interfaces, as shown in FIG. 5. Therefore, if compression stresses are exerted on the Cu layers, the Cu layers are reliably prevented from peeling off from the Cr—Cu alloy layers.

Cu layers are provided as the respective outermost layers of a Cr—Cu alloy/Cu laminate due to following reasons.

A Cr—Cu material, like a Mo—Cu material or a W—Cu material, is generally subjected to Ni plating treatment to improve wetting properties thereof with respect to solder and/or brazing. Since Ni plating directly provided on Cr, Mo, W composite materials exhibits relatively poor adhesion properties between the composite materials and itself due to, for example, an influence of oxides present on a plated surface, there are generally carried out specific etching treatment, an intermediate heat treatment within a plating process, a heat treatment after the plating process, and the like, to improve the adhesion properties, which specific treatments however tends to increase plating-related cost.

In this regard, providing Cu layers as the outermost layers of a laminate makes it possible to conduct Ni plating on an ordinary Cu material, which is simple and easy. Further, Ni plating may be eliminated and soldering can be carried out directly on a pure copper surface of the laminate without risking reliable bonding. Yet further, we confirmed that press forming can be easily carried out on the Cr—Cu alloy/Cu laminate.

Although there is no particular restriction regarding the number of layers of Cr—Cu alloy and Cu to be laminated in a Cr—Cu alloy/Cu laminate, it is preferable that the laminate includes 1 to 10 Cr—Cu layers and 2 to 11 Cu layers (i.e., the number of Cu layers is to be larger by one than the number of Cr—Cu layers).

Further, although there is no particular restriction regarding thickness of a Cr—Cu alloy layer and thickness of a Cu layer, except that thickness of the outermost layer facing a semiconductor need be controlled, each of the Cr—Cu alloy layer and the Cu layer preferably has thickness in the range of 50 µm to 200 µm. It should be noted that thickness of a Cu layer facing a semiconductor, in particular, preferably does not exceed 100 µm. In a case where a Cu layer facing a semiconductor on one side and being constrained by a Cr—Cu layer on the other side (note that the surface of the Cu layer on the one side is less constrained than the surface on the other side) is relatively thick, the surface of the Cu layer on the one side, which is relatively free, exhibits the thermal expansion coefficient inherent to a Cu material, thereby possibly suffering from plastic deformation such as creases.

One of the outermost Cu layers of a Cr—Cu alloy/Cu laminate (i.e., the outermost layer not facing a semiconductor) may be thicker than the other of the outermost Cu layers (i.e., the outermost layer facing a semiconductor) of the Cr—Cu alloy/Cu laminate.

The one outermost Cu layer, which does not face a semiconductor and is relatively thick, can then have thermal expansion coefficient close to the thermal expansion coefficient inherent to a Cu material and enjoy a good effect caused by such a relatively high thermal expansion coefficient in a manner exactly opposite to the case of the outermost Cu layer facing a semiconductor. Thickness of the outermost Cu layer not facing a semiconductor is preferably at least 100 µm, and more preferably at least 500 µm.

Regarding a method of producing a Cr—Cu alloy/Cu laminate, the Cr—Cu alloy/Cu laminate can be produced by either: preparing a Cr—Cu rolled sheet by rolling a Cu-infiltrated Cr sintered body; preparing a rolled or unrolled Cu sheet; and laminating a desired number of the Cr—Cu rolled sheets and the Cu sheets and joining the sheets to each other, or preparing a Cr—Cu alloy sheet such as a Cu-infiltrated Cr sintered body or a Cr—Cu rolled sheet; preparing a Cu sheet; laminating a desired number of the Cr—Cu alloy sheets and the Cu sheets and rolling the laminated sheets to obtain a laminate. The latter method is economically advantageous because required bonding and rolling processes can be lessened.

The rolling reduction rate in the method for producing a Cr—Cu alloy/Cu laminate is to be at least 80% and preferably at least 90% because the larger rolling reduction rate results in the lower thermal expansion coefficient, as well as the further improvement of thermal conductivity in thickness direction caused by insertion of Cu layers.

Regarding a method for joining a Cr—Cu alloy sheet to a Cu sheet, diffusion bonding by spark plasma sintering (SPS) or hot press is particularly suitable and advantageous.

Next, the reason for why Cr content is to be restricted to the aforementioned range in Cr—Cu alloy will be described.

Chromium is an important element in terms of successfully decreasing thermal expansion coefficient in the Cr—Cu alloy. In a case where Cr content is not more than 30 mass %, sufficiently low thermal expansion coefficient (approximately $14 \times 10^{-6}$ $K^{-1}$ or less) required for reliable bonding with a semiconductor material cannot be obtained. In a case where Cr content exceeds 80 mass %, smooth infiltration into Cr grains is disturbed and satisfactory rolling may not be carried out in a reliable manner. Accordingly, Cr content is to be restricted to the range of more than 30 mass % and not more than 80 mass %.

The remainder of the Cr—Cu alloy is Cu and incidental impurities.

Among the incidental impurities, O, N, C, Al and Si, in particular, tend to deteriorate cold rolling formability. Accordingly, contents of O, N, C, Al and Si are preferably suppressed to O: 0.08 mass % or less, N: 0.03 mass % or less, C: 0.03 mass % or less, Al: 0.05 mass % or less, and Si: 0.10 mass % or less, respectively.

Specifically, a satisfactory Cr—Cu alloy sheet which is free of cracks even under relatively high pressure can be obtained by reducing contents of O, N, C in the Cr—Cu alloy to O: 0.08 mass % or less, N: 0.03 mass % or less, C: 0.03 mass % or less, respectively.

Further, we discovered that ductility of a Cr—Cu alloy sheet in press forming improves such that rolling at rolling reduction rate of 90% or more is possible by reducing contents of Al and Si, which are inevitably mixed into Cr—Cu alloy during a production process thereof.

Regarding other incidental impurities, S, P and Fe may exist at contents of S: 0.03 mass % or less, P: 0.02 mass % or less, Fe: 0.3 mass % or less, respectively.

Powder metallurgical techniques of using Cr powder as Cr material need be employed to obtain Cr—Cu alloy. It is possible to produce Cr—Cu alloy in which more than 30 mass % of Cr is uniformly distributed by charging only Cr powder or mixture of Cr powder and Cu powder in a mold, sintering the powder to produce a porous body, and making Cu infiltrate the porous body. Preferable porosity expected for such a porous body obtained by sintering only Cr powder as described above is around 15 to 65 vol. % as a value measured according to "test methods for pore size distribution of fine ceramic green body by mercury porosimetry" (JIS R1655: 2003). Adjustment of porosity in preparing a porous body can be carried out by appropriately adjusting pressure during a molding process after raw material powder is charged in a mold. Alternatively, raw material powder may be sintered without any artificial pressure applied thereto after it is charged in a mold (i.e., sintering in a state of "natural charging").

Cr powder having purity of at least 99% is preferably used. Regarding particle size of Cr powder, it is preferable to use Cr powder obtained by particle-size classification using a sieve having sieve-opening size of 50 to 325 mesh (45 µm to 300 µm), preferably 100 to 200 mesh (75 µm to 150 µm).

It is preferable to reduce impurity contents in Cr powder as much as possible in terms of improving formability and thermal conductivity of a Cu-infiltrated Cr sintered body obtained by making Cu infiltrate a porous sintered body.

Cr powder is obtained by preparing metal blocks or metal flakes generally by electrolysis, aluminothermic process, electric smelting or the like, and mechanically pulverizing the metal blocks or metal flakes. Al and Si are elements contained as incidental impurities by relatively large contents in Cr raw material thus obtained. The raw material Cr powder contains gaseous components such as C, N, O as incidental impurities by relatively large contents. Fe may also be mixed into the raw material Cr powder during the mechanical pulverization process.

The raw material Cr powder contains aluminum as incidental impurities. In a case where Cr raw material is produced by aluminothermic process, in particular, a larger amount of Al may enter Cr powder than in other production methods of Cr raw material. A portion of Al exists as solute aluminum in Cu in the Cr—Cu alloy. The rest of Al exists as oxide particles in the Cr—Cu alloy and it has been revealed that these Al oxides deteriorate press formability in cold rolling of the Cr—Cu alloy (sheet). Further, Si, similar to Al, deteriorates press formability of the Cr—Cu alloy sheet in cold rolling. Yet further, solute Si in Cu significantly deteriorates thermal conductivity of Cu. Accordingly, Al and Si are unfavorable elements in a heat sink member for semiconductor and contents thereof are to be preferably suppressed to the aforementioned ranges.

Carbon and nitrogen are bonded to chromium, forming carbide and nitride, thereby significantly deteriorating ductility of a Cr—Cu alloy sheet. A portion of oxygen exists as solute oxygen in Cu, to deteriorate thermal conductivity of the Cr—Cu alloy. Oxygen is also bonded to Cr to form oxides, thereby deteriorating thermal properties and ductility of a Cr—Cu alloy sheet. Accordingly, it is preferable to suppress contents of C, N and O to the aforementioned ranges.

Industrially produced electrolytic copper powder, atomized copper powder and the like are preferably used as Cr powder.

Regarding Cu to be made to infiltrate a porous sintered body obtained by sintering Cr powder, metal Cu sheets of industrially produced tough-pitch copper, phosphorous-deoxidized copper, oxygen-free copper or Cu powder such as electrolytic copper powder, atomized copper powder, and the like, is preferably used.

Cr—Cu alloy having desired thickness can be obtained by subjecting the Cu-infiltrated Cr sintered body to cutting (machining) and/or grinding to remove residual Cu on surfaces of the sintered body.

In a case where cutting is carried out, milling by cemented carbide tip is preferable in terms of enhancing work efficiency. However, since chipping of cemented carbide tip possibly causes scars at a surface of a Cr—Cu alloy sheet, it is important to keep maintaining cemented carbide tip in a good condition. Use of cemented carbide tip coated with CrN or the like is preferable to enhance durability of cemented carbide tip.

Cr phase in Cu matrix of Cr—Cu alloy thus obtained is made flat by subjecting the Cr—Cu alloy to cold rolling or hot rolling. Cr phase of which aspect ratio does not exceed 10 cannot cause an effect of decreasing thermal expansion coefficient in a sufficiently satisfactory manner. Accordingly, aspect ratio of Cr phase is to exceed 10 and is preferably at least 50.

Aspect ratio of Cr phase is a value obtained by: determining relevant lengths ($L_1$, $L_2$) from optical microscopic observation of a section in a direction in which the long-side diameter of flattened Cr phase looks longest (more specifically, a section in the rolled or sheet-spread direction and the rolling-down direction of a Cu-infiltrated Cr sintered body subjected to cold rolling or hot rolling), selected from sections in thickness direction of a Cr—Cu alloy sheet; and inputting the $L_1$ and $L_2$ lengths into formula (1) below. Cr phases in a field of view are observed by an optical microscope at ×100 to 400 magnification and aspect ratios of the Cr phases are calculated, respectively, to then obtain the average value of these aspect ratios. Only Cr phases which are completely included within a field of view are to be analyzed. In a case where plural Cr phases look combined to form a structure, the structure is to be disassembled into plural Cr phases and aspect ratios of respective Cr phases thus disassembled are to be calculated.

$$\text{Aspect ratio}=L_1/L_2 \tag{1}$$

$L_1$ in formula (1) represents, in a section in a direction in which the long-side diameter of flattened Cr phase looks longest, selected from sections in thickness direction of a Cr—Cu alloy sheet, the maximum length of long-side diameter in the direction in which the long-side diameter looks longest. $L_2$ in formula (1) represents, in a section in a direction in which the long-side diameter of flattened Cr phase looks longest, selected from sections in thickness direction of a Cr—Cu alloy sheet, the maximum length in the thickness direction. In the case where a Cr—Cu alloy sheet is obtained by subjecting a Cu-infiltrated Cr sintered body to cold rolling or hot rolling, the direction in which the long-side diameter of flattened Cr phase looks longest is the rolled or sheet-spread direction. In the case where a Cr—Cu alloy sheet is obtained by rolling a Cu-infiltrated Cr sintered body in two directions, one of these directions in which the long-side diameter of flattened Cr phase looks longer is the direction in which the long-side diameter of flattened Cr phase looks longest.

Density of flat Cr phase in thickness direction thereof (number/mm) is preferably in the range of 10 phases/mm to 1000 phases/mm (inclusive of 10 phases/mm and 1000 phases/mm). When the density of flat Cr phase is less than 10 phases/mm, formation of layer-like structure of Cr phase is insufficient, thereby causing a problem that an effect of decreasing thermal expansion coefficient in the rolled or sheet-spread direction by Cr phase is not satisfactory. When density of flat Cr phase exceeds 1000 phases/mm, Cr phases are in contact with each other and cut off connections between Cu phases which effectively contribute to thermal conductivity, thereby adversely affecting thermal conductivity of a Cr—Cu alloy sheet.

Density of flat Cr phases in thickness direction is determined by observing a section of a Cr—Cu alloy sheet over the entire area in thickness direction, determining the average number of Cr phases per unit length in thickness direction, and converting the average number into the density per mm in thickness direction. Specifically, the average number of Cr phases per unit length in thickness direction is determined by counting the number of Cr phases crossing each of 20 lines aligned in parallel in thickness direction in a field of view and calculating the average number of crossing Cr phases of these 20 lines.

In the case of a "bonded-and-rolled product," i.e., a product obtained by joining a Cr—Cu alloy material to a Cu material and rolling the joint product, the "bonded-and-rolled" product is preferably heated at temperature in the range of 300° C. to 900° C. after being rolled. In this case, it is more preferable to: either conduct cooling in cooling process in diffusion bonding at cooling rate not exceeding 30° C./minute or conduct solution heat treatment in the range of 900° C. to 1050° C. after diffusion bonding and then cooling at cooling rate not exceeding 30° C./minute; and heat the product at temperature in the range of 500° C. to 750° C. after being rolled. Similarly, in the case of a "rolled-and-bonded" product, i.e., a product obtained by rolling a Cr—Cu alloy material and joining the Cr—Cu alloy material thus rolled to a Cu material, the "rolled-and-bonded" product is preferably heated at temperature in the range of 300° C. to 900° C. after being joined. In this case, it is more preferable to: conduct heating at temperature in the range of 300° C. to 900° C. prior to rolling; either conduct cooling in cooling process in diffusion bonding at cooling rate not exceeding 30° C./minute or conduct solution heat treatment in the range of 900° C. to 1050° C. after diffusion bonding and then cooling at cooling rate not exceeding 30° C./minute; and heat the product at temperature in the range of 500° C. to 750° C.

It is preferable in terms of decreasing thermal expansion coefficient to conduct cooling, heating and the like as described above, so that grain-like Cr phase, each having long diameter of not larger than 100 nm and aspect ratio of less than 10, is precipitated in addition to flattened Cr phase in Cu matrix. Density of grain-like Cr phase is preferably at least 20 phases/μm². Density of grain-like Cr phase is determined by a method of: observing grain-like Cr phase by a scanning electron microscope (SEM) at a low acceleration voltage of 1 to 5 kV at ×10,000 to 300,000 magnification; and calculating density of grain-like Cr phase (number/μm²) from the number of Cr phases visually confirmed within a field of view.

It is possible to obtain a heat sink constituted of Cr—Cu alloy/Cu laminate having relatively low thermal expansion properties and thermal conductivity excellent not only in in-plane directions but also in the direction of thickness.

Figure 6:
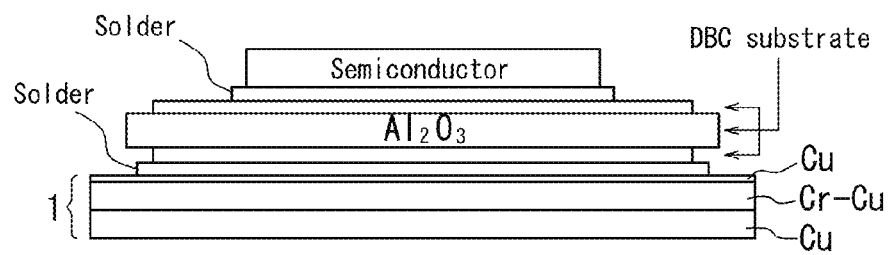
FIG. 6 is a diagram showing a state where a heat sink is provided on a DBC substrate.
Figure 7:
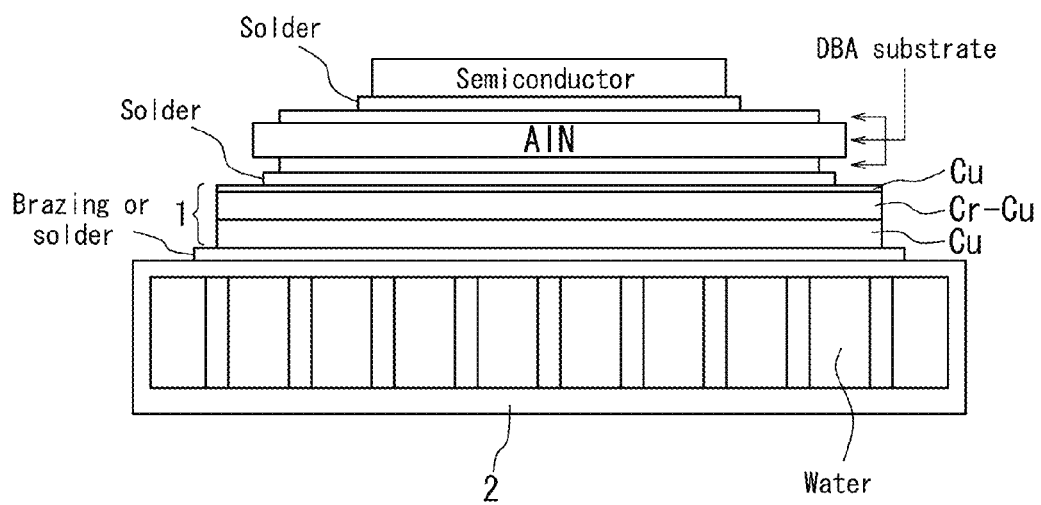
FIG. 7 is a diagram showing a state where a heat sink is provided on a DBA substrate and further combined with a cooling device made of aluminum.

FIG. 6 and FIG. 7 show typical examples of heat sink substrate members for an electronic device, including the heat sink provided therein, respectively.

FIG. 6 shows an example where a heat sink 1 is provided on a laminate substrate of copper-metalized alumina ceramic (a DBC substrate). FIG. 7 shows an example where a heat sink 1 is provided on a laminate substrate of aluminum-metalized alumina nitride (a DBA substrate) and further combined with a cooling device 2 made of aluminum. In the examples shown in FIG. 6 and FIG. 7, the heat sink has a three-layered structure including a Cu layer, a Cr—Cu alloy layer and a Cu layer from the top.

EXAMPLES

Cr powder (particle size: 50 μm to 200 μm) was naturally charged at an ambient pressure in a mold and sintered in vacuum, whereby a sintered body (70×70×4.5 mm) having porosity: 45 vol. % (corresponding to 50 mass % when converted into Cr content after Cu infiltration) was produced. The sintering temperature was 1500° C. and the sintering time was 60 minutes. A Cu plate was placed on the top surface of the sintered body thus obtained and Cu was melted by heating the sintered body and the Cu plate thereon at 1200° C. (holding time: 30 minutes) in vacuum so that Cu infiltrated the sintered body, to obtain a Cu-infiltrated Cr sintered body. After the infiltration treatment, the Cu-infiltrated Cr sintered body was cooled at the average cooling rate: 26° C./minute. The Cu-infiltrated Cr sintered body was then heated at 600° C. (holding time: 120 minutes) in vacuum.

Next, residual Cu on a surface of the Cr—Cu alloy was removed by a milling machine, whereby a Cr—Cu alloy sheet having thickness: 3.0 mm was obtained. Analysis of the Cu-infiltrated Cr sintered body (a Cr—Cu alloy sheet) revealed following results. O: 0.04 mass % or less, N: 0.02 mass % or less, C: 0.02 mass % or less, Al: 0.01 mass % or less, and Si: 0.01 mass % or less, P: 0.01 mass % or less, S: 0.01 mass % or less, and Fe: 0.15 mass %.

Example 1

The Cr—Cu alloy sheet thus prepared was subjected to cold cross rolling with controllably setting rolling reduction rates in the two rolling directions to be equal to each other until the Cr—Cu alloy sheet had thickness of 0.05 mm (the final reduction rate: 98.3%), whereby a rolled Cr—Cu alloy sheet was obtained. Pieces (65 mm×65 mm) were cut out of the rolled Cr—Cu alloy sheet. A pure copper sheet (size: 65 mm×65 mm, thickness: 0.1 mm) and a layer of two overlapped Cr—Cu alloy sheet pieces (each layer was constituted of two overlapped rolled Cr—Cu alloy sheet pieces and had thickness: 0.1 mm), and another pure copper . . . were alternately laminated on each other to form a laminate including four layers of the rolled Cr—Cu alloy sheet pieces and five pure copper sheets. The laminate was subjected to diffusion bonding by using a spark plasma sintering (SPS) device ("DR. SINTER SPS-1050," manufactured by Sumitomo Coal Mining Co., Ltd.) under conditions of 900° C., 40-minutes holding time, and applied pressure: 20 MPa, whereby a Cr—Cu alloy/Cu laminate was obtained.

A test piece was cut out of the Cr—Cu alloy/Cu laminate thus obtained and subjected to heat treatment at 600° C. (holding time: 120 minutes). Then, thermal conductivity in thickness direction of the test piece was measured by the laser flash techniques. The thermal conductivity in thickness direction was 230 W/mK and the thermal conductivity in an in-plane direction was 295 W/mK, thereby demonstrating that the Cr—Cu alloy-Cu laminate had excellent heat sink properties.

Further, the average thermal expansion coefficient in 50 to 900° C. of the test piece of the Cr—Cu alloy/Cu laminate, then measured, was $12.6 \times 10^{-6}$/K.

A semiconductor case for use in optical communication, such as a butterfly package, generally has a structure in which the semiconductor case is attached to a Kovar material (Ni: 29%-Co: 17%-Fe) by brazing at temperature around 850° C. The average thermal expansion coefficient of the Kovar material, then measured, was $11.5 \times 10^{-6}$/K. That is, the aforementioned average thermal expansion coefficient of the Cr—Cu alloy/Cu laminate is close to the average thermal expansion coefficient of the Kovar material. Accordingly, it was confirmed that a semiconductor case having less strain than the prior art can be assembled by attaching a heat sink member of the heat sink laminate and a counterpart Kovar member by brazing.

Semiconductor cases often have rectangular-shapes. In such rectangular-shaped semiconductor cases, increasing a proportion of the Cr—Cu alloy layer in the heat sink laminate is effective, in particular, in terms of making the average thermal expansion coefficient of the semiconductor case close to the average thermal expansion coefficient of the Kovar material. However, such increase in a proportion of the Cr—Cu alloy layer in the heat sink laminate results in decrease in thermal conductivity of the laminate in thickness direction. Although difference in thermal expansion coefficient between a rolling direction and a direction orthogonal to the rolling direction tends to decrease by increasing rolling reduction rate of the Cr—Cu alloy material, even in single-direction rolling, the difference cannot be completely eliminated. Therefore, in a case of using a rectangular-shaped heat sink, it is possible to assemble a semiconductor case exhibiting relatively little strain when the case is attached to a Kovar member by brazing, by conducting cross rolling of the Cr—Cu alloy member such that rolling reduction rate in the long-side direction thereof is larger than that in the short-side direction.

Example 2

A Cr—Cu alloy/Cu laminate was obtained in the same manner as in Example 1, except that the (unrolled) Cr—Cu alloy sheet was subjected to cold cross rolling until the Cr—Cu alloy sheet had thickness of 0.10 mm (the final reduction rate: 96.7%) to obtain a rolled Cr—Cu alloy sheet, pieces (65 mm×65 mm) were cut out of the thus rolled Cr—Cu alloy sheet, and a pure copper sheet (size: 65 mm×65 mm, thickness: 0.1 mm) and a rolled Cr—Cu alloy sheet piece having 0.10 mm thickness, and another pure copper . . . were alternately laminated on each other to form a laminate including four rolled Cr—Cu alloy sheet pieces and five pure copper sheets.

A test piece cut out of the Cr—Cu alloy/Cu laminate thus obtained was subjected to heat treatment at 600° C. (holding time: 120 minutes). Then, thermal conductivity in thickness direction of the test piece was measured by the laser flash techniques. The thermal conductivity in thickness direction was 230 W/mK and the thermal conductivity in an in-plane direction was 298 W/mK, thereby demonstrating that the Cr—Cu alloy-Cu laminate had excellent heat sink properties. Further, the average thermal expansion coefficient in 50 to 900° C. of the test piece of the Cr—Cu alloy/Cu laminate, then measured, was $12.5 \times 10^{-6}$/K, thereby demonstrating that the Cr—Cu alloy/Cu laminate has thermal expansion coefficient low enough to avoid any troubles in bonding by brazing.

Example 3

A Cr—Cu alloy/Cu laminate was obtained in the same manner as in Example 1, except that the (unrolled) Cr—Cu alloy sheet was subjected to cold cross rolling until the Cr—Cu alloy sheet had thickness of 0.15 mm (the final reduction rate: 95.0%) to obtain a rolled Cr—Cu alloy sheet, pieces (65 mm×65 mm) were cut out of the thus rolled Cr—Cu alloy sheet, and a pure copper sheet (size: 65 mm×65 mm, thickness: 0.1 mm) and a rolled Cr—Cu alloy sheet piece having 0.15 mm thickness, and another pure copper . . . were alternately laminated on each other to form a laminate including four rolled Cr—Cu alloy sheet pieces and five pure copper sheets.

A test piece cut out of the Cr—Cu alloy/Cu laminate thus obtained was subjected to heat treatment at 600° C. (holding time: 120 minutes). Then, thermal conductivity in thickness direction of the test piece was measured by the laser flash techniques. The thermal conductivity in thickness direction was 195 W/mK and the thermal conductivity in an in-plane direction was 280 W/mK, thereby demonstrating that the Cr—Cu alloy-Cu laminate had excellent heat sink properties. Further, the average thermal expansion coefficient in 50 to 900° C. of the test piece of the Cr—Cu alloy/Cu laminate, then measured, was $11.6 \times 10^{-6}$/K, thereby demonstrating that the Cr—Cu alloy/Cu laminate has thermal expansion coefficient low enough to avoid any troubles in bonding by brazing.

Example 4

Two unrolled Cr—Cu alloy sheets (each sheet having thickness: 3.0 mm) prepared as the Cu-infiltrated Cr sintered body and four Cu sheets (each sheet having thickness: 1.0 mm) were laminated in the order of a Cu sheet-a (Cr—Cu) sheet-two Cu sheets-a (Cr—Cu) sheet-a Cu sheet from the top and subjected to diffusion bonding or joining by SPS. The joined product was then subjected to cold rolling (rolling reduction rate: 81.3%), whereby a rolled Cr—Cu alloy sheet having thickness: 1.2 mm was obtained.

A test piece cut out of the "diffusion-bonded and rolled" sheet thus obtained was subjected to heat treatment at 600° C. (holding time: 120 minutes). Then, thermal conductivity in thickness direction of the test piece was measured by the laser flash techniques. The thermal conductivity in thickness direction was 165 W/mK and the thermal conductivity in an in-plane direction was 243 W/mK, thereby demonstrating that the "diffusion-bonded and rolled" sheet had excellent heat sink properties. Further, the average thermal expansion coefficient in 50 to 900° C. of the test piece of the "diffusion-bonded and rolled" sheet, then measured, was $12.9 \times 10^{-6}$/K.

It was therefore confirmed that better thermal properties were achieved in Example 4 than in the Cr—Cu sheet as a single material not including Cu sheets, of Comparative Example 2.

Example 5

Two unrolled Cr—Cu alloy sheets (each sheet having thickness: 7.5 mm) prepared as the Cu-infiltrated Cr sintered body and three Cu sheets (each sheet having thickness: 3.0 mm) were laminated in the order of a Cu sheet-a (Cr—Cu) sheet-a Cu sheet-a (Cr—Cu) sheet-a Cu sheet from the top and subjected to diffusion bonding or joining by SPS. The joined product was then subjected to cold rolling (rolling reduction rate: 96.7%), whereby a rolled Cr—Cu alloy sheet having thickness: 0.8 mm was obtained.

A test piece cut out of the "diffusion-bonded and rolled" sheet thus obtained was subjected to heat treatment at 600° C. (holding time: 120 minutes). Then, thermal conductivity in thickness direction of the test piece was measured by the laser flash techniques. The thermal conductivity in thickness direction was 170 W/mK and the thermal conductivity in an in-plane direction was 275 W/mK, thereby demonstrating that the "diffusion-bonded and rolled" sheet had excellent heat sink properties. Further, the average thermal expansion coefficient in 50 to 900° C. of the test piece of the "diffusion-bonded and rolled" sheet, then measured, was $11.7 \times 10^{-6}$/K, thereby demonstrating that the "diffusion-bonded and rolled" sheet has thermal expansion coefficient low enough to avoid any troubles in bonding by brazing.

Example 6

Four unrolled Cr—Cu alloy sheets (each sheet having thickness: 5.25 mm) prepared as the Cu-infiltrated Cr sintered body and five Cu sheets (each sheet having thickness: 3.5 mm) were laminated in the order of a Cu sheet-a (Cr—Cu) sheet-a Cu sheet-a (Cr—Cu) sheet-a Cu sheet-a (Cr—Cu) sheet-a Cu sheet-a (Cr—Cu) sheet-a Cu sheet from the top and subjected to diffusion bonding or joining by SPS. The joined product was then subjected to cold rolling (rolling reduction rate: 97.1%), whereby a rolled Cr—Cu alloy sheet having thickness: 1.1 mm was obtained.

A test piece cut out of the "diffusion-bonded and rolled" sheet thus obtained was subjected to heat treatment at 600° C. (holding time: 120 minutes). Then, thermal conductivity in thickness direction of the test piece was measured by the laser flash techniques. The thermal conductivity in thickness direction was 197 W/mK and the thermal conductivity in an in-plane direction was 290 W/mK, thereby demonstrating that the "diffusion-bonded and rolled" sheet had excellent heat sink properties. Further, the average thermal expansion coefficient in 50 to 900° C. of the test piece of the "diffusion-bonded and rolled" sheet, then measured, was $12.2 \times 10^{-6}$/K, thereby demonstrating that the "diffusion-bonded and rolled" sheet has thermal expansion coefficient low enough to avoid any troubles in bonding by brazing. Yet further, the average thermal expansion coefficient in 20 to 200° C. of the test piece of the "diffusion-bonded and rolled" sheet was $11.2 \times 10^{-6}$/K, thereby demonstrating that the "diffusion-bonded and rolled" sheet has thermal expansion coefficient low enough to avoid any troubles in soldering.

Comparative Example 1

Square pieces were cut out of the rolled Cr—Cu alloy sheet (thickness: 0.1 mm) obtained in Example 2. Eleven pieces of the rolled Cr—Cu alloy sheet were laminated on each other to form a diffusion-bonded product in the same manner as in Example 1. A test piece cut out of the diffusion-bonded product thus obtained was subjected to heat treatment at 600° C. (holding time: 120 minutes). Then, thermal conductivity in thickness direction of the test piece was measured by the laser flash techniques. The thermal conductivity in thickness direction was 122 W/mK and the thermal conductivity in an in-plane direction was 189 W/mK, thereby proving that the diffusion-bonded product exhibited poor thermal conductivity in thickness direction.

Further, the average thermal expansion coefficient in 50 to 900° C. of the test piece of the diffusion-bonded product was $11.0 \times 10^{-6}$/K.

Comparative Example 2

An unrolled Cr—Cu alloy sheet as a Cu-infiltrated Cr sintered body was obtained in the same manner as the method of preparing the unrolled Cr—Cu alloy sheet as the Cu-infiltrated Cr sintered body used in Examples described above, except that the Cu-infiltrated Cr sintered body was prepared to have porosity corresponding to 45 mass % when converted into Cr content after Cu infiltration, by adjusting a charging ratio of the Cr powder. The Cr—Cu alloy sheet having porosity corresponding to 45 mass % of Cr thus prepared was subjected to cold cross rolling with controllably setting rolling reduction rates in the two rolling directions to be equal to each other until the Cr—Cu alloy sheet had thickness of 1.0 mm (the final reduction rate: 75.0%), whereby a rolled Cr—Cu alloy sheet was obtained. A test piece cut out of the rolled Cr—Cu alloy sheet thus obtained was subjected to heat treatment at 600° C. (holding time: 120 minutes). Then, thermal conductivity in thickness direction of the test piece was measured by the laser flash techniques. The thermal conductivity in thickness direction was 160 W/mK and the thermal conductivity in an in-plane direction was 210 W/mK.

Further, the average thermal expansion coefficient in 50 to 900° C. of the test piece of the rolled Cr—Cu alloy sheet, then measured, was $13.0 \times 10^{-6}$/K.

Table 1 shows thermal properties from Examples and Comparative Examples described above in a comparative manner.

TABLE 1

| | Type of alloy sheet | Average thermal expansion coefficient in 50° C.~900° C. ($\times 10^{-6}$/K) | Thermal conductivity in thickness direction (W/mK) | Cr—Cu layer ratio | Rolling reduction ratio (%) | Theoretical average thermal expansion coefficient according to the rule of mixture ($\times 10^{-6}$K) | Discrepancy rate (%) from from the rule of mixture (1 − measured value/theoretical value) × 100 |
|---|---|---|---|---|---|---|---|
| Example 1 | "Rolled-and-diffusion bonded" product | 12.6 | 230 | 0.44 | 98.3 | 16.5 | 24 |
| Example 2 | | 12.5 | 230 | 0.44 | 96.7 | 16.5 | 24 |
| Example 3 | | 11.6 | 195 | 0.55 | 95.0 | 15.4 | 25 |
| Example 4 | "Diffusion bonded-and-rolled" product | 12.9 | 165 | 0.75 | 81.3 | 14.2 | 9 |
| Example 5 | | 11.7 | 170 | 0.63 | 96.7 | 14.6 | 20 |
| Example 6 | | 12.2 | 197 | 0.55 | 97.1 | 15.4 | 21 |
| Comp. Example 1 | 50Cr—Cu rolled material | 11.0 | 122 | 1.0 | 96.7 | — | — |
| Comp. Example 2 | 45Cr—Cu rolled material | 13.0 | 160 | 1.0 | 75.0 | — | — |

It is understood from Table 1 that the average thermal expansion coefficient values remarkably lower than those theoretically calculated according to the rule of mixture are obtained in Examples. Rolling reduction rate of the Cr—Cu alloy material is preferably at least 80% and more preferably at least 90%. Joining a Cu material to a Cr—Cu alloy material rolled at the larger rolling reduction rate achieves the larger discrepancy from the rule of mixture.

Theoretical thermal expansion coefficient according to the rule of mixture was calculated by formula below:

Theoretical thermal expansion coefficient=(ratio of the total thickness of rolled Cr—Cu alloy layers with respect to the thickness of the product as a whole)×(thermal expansion coefficient of rolled Cr—Cu alloy layer material at a given rolling reduction rate)+(ratio of the total thickness of pure Cu layers with respect to the thickness of the product as a whole)×(thermal expansion coefficient of pure Cu layer material).

Example 7

Two unrolled Cr—Cu alloy sheets (each sheet having thickness: 6.0 mm) prepared as the Cu-infiltrated Cr sintered body and six Cu sheets (each sheet having thickness: 3.0 mm) were laminated in the order of a Cu sheet-a (Cr—Cu) sheet-four Cu sheets-a (Cr—Cu) sheet-a Cu from the top and subjected to diffusion bonding or joining by SPS. This diffusion bonding was carried out by using the SPS device described in Example 1 under conditions of 900° C., 40-minutes holding time, and applied pressure: 20 MPa, and then the product was cooled at the average cooling rate of 22° C./minute. Thereafter, the product was subjected to cold rolling (rolling reduction rate: 96.7%), whereby a rolled Cr—Cu alloy sheet having thickness: 1.0 mm was obtained.

Thermal conductivity in thickness direction of a test piece cut out of the "diffusion-bonded and rolled" sheet thus obtained, which test piece was not subjected to heat treatment, was analyzed by the laser flash techniques. The thermal conductivity in thickness direction was 210 W/mK and the thermal conductivity in an in-plane direction was 310 W/mK, thereby demonstrating that the "diffusion-bonded and rolled" sheet had excellent heat sink properties. However, the average thermal expansion coefficient in 50 to 200° C. of the test piece of the "diffusion-bonded and rolled" sheet was $14.5 \times 10^{-6}$/K, which is too high for use with a semiconductor. On the other hand, another test piece cut out of the same "diffusion-bonded and rolled" sheet was subjected to heat treatment at 600° C. (holding time: 120 minutes) and then thermal conductivity in thickness direction of the test piece was measured by the laser flash techniques. The thermal conductivity in thickness direction was 246 W/mK and the thermal conductivity in an in-plane direction was 326 W/mK, thereby demonstrating that the heat-treated "diffusion-bonded and rolled" sheet had more excellent heat sink properties than the same sheet which had not been heat-treated. Further, the average thermal expansion coefficient in 50 to 200° C. of this second test piece of the "diffusion-bonded and rolled" sheet was $12.3 \times 10^{-6}$/K, which is much lower than the corresponding value of the first test piece ($14.5 \times 10^{-6}$/K), thereby demonstrating that the heat-treated "diffusion-bonded and rolled" sheet has thermal expansion coefficient low enough to avoid any troubles in soldering.

Example 8

Two unrolled Cr—Cu alloy sheets (each sheet having thickness: 8.0 mm) prepared as the Cu-infiltrated Cr sintered body and seven Cu sheets (each sheet having thickness: 2.0 mm) were laminated in the order of a Cu sheet-a (Cr—Cu) sheet-five Cu sheets-a (Cr—Cu) sheet-a Cu from the top and subjected to diffusion bonding or joining by SPS under the same conditions as in Example 7. The product was then subjected to cold rolling (rolling reduction rate: 96.7%), whereby a rolled Cr—Cu alloy sheet having thickness: 1.0 mm was obtained.

Thermal conductivity in thickness direction of a test piece cut out of the "diffusion-bonded and rolled" sheet thus obtained, which test piece was not subjected to heat treatment, was analyzed by the laser flash techniques. The thermal conductivity in thickness direction was 175 W/mK and the thermal conductivity in an in-plane direction was 280 W/mK, thereby demonstrating that the "diffusion-bonded and rolled" sheet had excellent heat sink properties. Further, the average thermal expansion coefficient in 50 to 200° C. of the test piece of the "diffusion-bonded and rolled" sheet was $12.0 \times 10^{-6}$/K, thereby demonstrating that the sheet has thermal expansion coefficient low enough to avoid any troubles in soldering. Yet further, another test piece cut out of the same "diffusion-bonded and rolled" sheet was subjected to heat treatment at 600° C. (holding time: 120 minutes) and then thermal conductivity in thickness direction of the test piece was measured by the laser flash techniques. The thermal conductivity in thickness direction was 190 W/mK and the thermal conductivity in an in-plane direction was 300 W/mK, thereby demonstrating that the heat-treated "diffusion-bonded and rolled" sheet had more excellent heat sink properties than the same sheet which had not been heat-treated. Further, the average thermal expansion coefficient in 50 to 200° C. of this second test piece of the "diffusion-bonded and rolled" sheet was $11.0 \times 10^{-6}$/K, which is lower than the corresponding value of the first test piece ($12.0 \times 10^{-6}$/K), thereby demonstrating that the heat-treated "diffusion-bonded and rolled" sheet has thermal expansion coefficient low enough to avoid any troubles in soldering.

Example 9

The laminate heat sink obtained in Example 6 was press-formed to be a sheet (60 mm×40 mm). Similarly, the laminate heat sink obtained in Comparative Example 2 was press-formed to be a sheet (60 mm×40 mm). Respective sheets were provided with electrolytic Ni plating by 5 μm. For each of the sheets, a DBA substrate (50 mm×35 mm×1.5 mm) was placed on a surface thereof and attached to the surface by reflow soldering (solder material: Sn-3 mass % Ag-0.5 mass % Cu, and end-point temperature: 245° C.), so that a heat sink substrate member for an electronic device as shown in FIG. 7 was produced.

Next, each of the heat sink substrate members thus obtained was subjected to a thermal shock test in which the heat sink substrate member was retained in a −40° C. liquid bath for 5 minutes and then in a 120° C. liquid bath for 5 minutes. The test was carried out by using a liquid bath-type thermal shock test equipment "WINTECHLT 20," manufactured by Kusumoto Chemicals, Ltd.

After the thermal shock test, each sample was subjected to a ultrasonic testing to examine presence/absence of crack generation or the like.

As a result, coming-off was observed at a joined interface between the heat sink laminate and an aluminum cooling device in the heat sink substrate member using the laminate of Comp. Example 2 after conducting 1000 cycles of the thermal shock test. In contrast, no coming-off and/or crack generation was observed in the heat sink substrate member using the laminate of Example 6 even after completion of 3000 cycles of the thermal shock test.

Example 10

A rolled Cr—Cu alloy sheet piece having thickness of 0.15 mm (the final reduction rate: 95.0%) prepared in the same manner as in Example 3 and ten Cu sheets were laminated in the order of a Cu sheet-a rolled (Cr—Cu) alloy sheet-nine Cu sheets from the top and subjected to diffusion bonding and heat treatment as in Example 1, to obtain a Cr—Cu alloy/Cu laminate. A test piece was cut of the Cr—Cu alloy/Cu laminate and thermal conductivity in thickness direction of the test piece was measured by the laser flash techniques. The thermal conductivity in thickness direction was 340 W/mK, thereby demonstrating that the Cr—Cu alloy-Cu laminate had excellent heat sink properties.

Example 11

One unrolled Cr—Cu alloy sheet material (thickness: 3.0 mm) prepared as the Cu-infiltrated Cr sintered body as described above and twelve Cu sheets (each having thickness: 1.0 mm) were laminated in the order of a Cu sheet-a (Cr—Cu) sheet-eleven Cu sheets from the top and subjected to diffusion bonding or joining by SPS. The joined product was then subjected to cold rolling (rolling reduction rate: 92.7%), whereby a rolled Cr—Cu alloy sheet having thickness: 1.1 mm was obtained. A test piece cut out of the "diffusion-bonded and rolled" sheet thus obtained was subjected to heat treatment at 600° C. (holding time: 120 minutes). Then, thermal conductivity in thickness direction of the test piece was measured by the laser flash techniques. The thermal conductivity in thickness direction was 320 W/mK, thereby demonstrating that the "diffusion-bonded and rolled" sheet had excellent heat sink properties.

Example 12

Each of the heat sink laminates obtained by Examples 10 and 11 was press-formed to a sheet having size of 60 mm×40 mm. A DBA substrate (50 mm×35 mm×1.5 mm) was attached by solder to one surface close to the Cr—Cu alloy layer of the press-formed sheet, as in Example 7, and an aluminum cooling device having a cooling fan was attached to the other or opposite surface of the press-formed sheet, whereby a heat sink substrate member for an electronic device was produced. Further, the heat sink product obtained by Comparative Example 1 was press-formed to a sheet having size of 60 mm×40 mm. A DBA substrate and an aluminum cooling device were attached to respective surfaces of this comparative sheet in a manner similar to that described above, whereby a comparative heat sink substrate member was produced.

Next, each of the heat sink substrate members thus obtained was subjected to a thermal shock test in which the heat sink substrate member was retained in a −40° C. liquid bath for 5 minutes and then in a 120° C. liquid bath for 5 minutes in the same manner as in Example 9.

After the thermal shock test, each sample was subjected to a ultrasonic testing to examine presence/absence of crack generation or the like.

As a result, coming-off was observed at a joined interface between the heat sink laminate and the aluminum cooling device in the heat sink substrate member using the laminate of Comp. Example 1 after conducting 1000 cycles of the thermal shock test. In contrast, no coming-off and/or crack generation was observed on either the DBA substrate side or the aluminum cooling device side in the heat sink substrate members using the laminates of Example 10 and Example 11, respectively, even after completion of 3000 cycles of the thermal shock test.

INDUSTRIAL APPLICABILITY

The heat sink characteristically has relatively low thermal expansion coefficient and relatively high thermal conductivity and thus suitably used, in particular for, a semiconductor case, an inverter of a hybrid vehicle, and the like.

The invention claimed is:

1. A heat sink for an electronic device, comprising:
a laminate comprising at least two Cr—Cu alloy layers comprising a Cu matrix and more than 30 mass % and not more than 80 mass % of Cr, and at least three Cu layers, which layers are alternately laminated,
wherein an outmost layer of each of top and bottom surfaces of the laminate comprises a Cu layer, and bonding between the Cr—Cu alloy layer and the Cu layer is diffusion bonding.

2. The heat sink of claim 1, wherein the Cu layer as the outermost layer of one of top and bottom surfaces of the laminate is thicker than the Cu layer as an outermost layer of an other of the top and bottom surfaces of the laminate.

3. The heat sink of claim 1, wherein a Cr phase of the Cr—Cu alloy layer has a flat layer-like structure with an aspect ratio exceeding 10, and
density of the flat Cr phase in a thickness direction thereof is 10 phases/mm to 1000 phases/mm.

4. The heat sink of claim 2, wherein a Cr phase of the Cr—Cu alloy layer has a flat layer-like structure with an aspect ratio exceeding 10, and
density of the flat Cr phase in a thickness direction thereof is 10 phases/mm to 1000 phases/mm.

5. The heat sink of claim 3, wherein the Cr—Cu alloy layer includes, in addition to the flat Cr phase, Cr grains in the Cu matrix each having a long diameter of not larger than 100 nm and an aspect ratio of less than 10, and
density of the Cr grains is at least 20 grains/$\mu m^2$.

6. The heat sink of claim 4, wherein the Cr—Cu alloy layer includes, in addition to the flat Cr phase, Cr grains in the Cu matrix each having a long diameter of not larger than 100 nm and an aspect ratio of less than 10, and
density of the Cr grains is at least 20 grains/$\mu m^2$.

7. The heat sink of claim 1, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.

8. The heat sink of claim 2, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.

9. The heat sink of claim 3, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.

10. The heat sink of claim 4, wherein contents of O, N, C, Al, and Si as incidental impurities in the Cr—Cu alloy layer are suppressed to O: 0.08 mass or less, N: 0.03 mass % or less, C: 0.03 mass % or less, Al: 0.05 mass % or less, and Si: 0.10 mass % or less, respectively.

11. The heat sink of claim 5, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.

12. The heat sink of claim 6, wherein contents of O, N, C, Al, and Si as incidental impurities in the Cr—Cu alloy layer are suppressed to O: 0.08 mass % or less, N: 0.03 mass % or less, C: 0.03 mass % or less, Al: 0.05 mass % or less, and Si: 0.10 mass % or less, respectively.

13. The heat sink of claim 1, wherein thickness of the Cu layer facing a semiconductor in the electronic device does not exceed 100 µm.

14. The heat sink of claim 1, wherein thermal conductivity in thickness direction is 165 W/mK to 246 W/mK and the thermal conductivity in an in-plane direction is 243 W/mK to 326 W/mK.

15. A method for producing a heat sink comprising a Cr—Cu alloy layer having a Cu matrix and more than 30 mass % and not more than 80 mass % of Cr; and Cu layers provided on top and bottom surfaces of the Cr—Cu alloy layer, the method comprising:
removing Cu on a surface of a Cr—Cu alloy sheet having a Cu matrix and more than 30 mass % and not more than 80 mass % of Cr, the Cu on the surface being residual Cu in infiltration treatment;
joining a Cr—Cu alloy sheet to a Cu sheet by diffusion bonding; and
rolling a resulting joined product, thereby producing a laminate having a Cr—Cu alloy layer and a Cu layer.

16. A method for producing a heat sink comprising a Cr—Cu alloy layer having a Cu matrix and more than 30 mass % and not more than 80 mass % of Cr; and Cu layers provided on top and bottom surfaces of the Cr—Cu alloy layer, the method comprising:

preparing a Cu-infiltrated Cr sintered body containing a Cu matrix and more than 30 mass % and not more than 80 mass % of Cr;

removing Cu on a surface of the Cu-infiltrated Cr sintered body, the Cu on the surface being residual Cu in infiltration treatment;

rolling the Cu-infiltrated Cr sintered body, to obtain a Cr—Cu rolled sheet;

joining the Cr—Cu rolled sheet to a Cu sheet, thereby producing a laminate having a Cr—Cu alloy layer and a Cu layer by diffusion bonding.

* * * * *